(12) United States Patent
Hichri et al.

(10) Patent No.: US 7,279,426 B2
(45) Date of Patent: Oct. 9, 2007

(54) LIKE INTEGRATED CIRCUIT DEVICES WITH DIFFERENT DEPTH

(75) Inventors: Habib Hichri, Poughkeepsie, NY (US); Kimberly A. Larsen, Poughkeepsie, NY (US); Helen L. Maynard, Hopewell Junction, NY (US); Kevin S. Petrarca, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 43 days.

(21) Appl. No.: 11/162,766

(22) Filed: Sep. 22, 2005

(65) Prior Publication Data
US 2007/0066073 A1    Mar. 22, 2007

(51) Int. Cl.
*H01L 21/302* (2006.01)
(52) U.S. Cl. .............. 438/700; 438/424; 438/444; 438/706
(58) Field of Classification Search ............... 438/427, 438/424, 706, 712, 714, 444, 700
See application file for complete search history.

(56) References Cited
U.S. PATENT DOCUMENTS

| | | | |
|---|---|---|---|
| 6,207,534 B1 | 3/2001 | Chan et al. | |
| 6,362,012 B1 | 3/2002 | Chi et al. | |
| 6,486,529 B2 | 11/2002 | Chi et al. | |
| 6,542,379 B1 | 4/2003 | Lauffer et al. | |
| 6,806,805 B2 | 10/2004 | Ahn et al. | |
| 6,864,152 B1 * | 3/2005 | Mirbedini et al. | .......... 438/427 |
| 6,879,022 B2 | 4/2005 | Kobayashi | |
| 2004/0195652 A1 | 10/2004 | Okada | |

FOREIGN PATENT DOCUMENTS

JP         01232739 A2     9/1989

OTHER PUBLICATIONS

"High-Q Inductors in Standard Silicon Interconnect Technology and its Application to an Integrated RF Power Amplifier", Burghartz, et al, Electron Devices Meeting, 1995. International Washington, DC, USA 10-13, IEEE, Dec. 1995, New York, NY, USA, Dec. 10, 1995, pp. 1015-1017.

* cited by examiner

*Primary Examiner*—Lan Vinh
(74) *Attorney, Agent, or Firm*—Lisa U. Jaklitsch; Rosa S. Yaghmour

(57) ABSTRACT

The invention forms integrated circuit devices of similar structure and dissimilar depth, such as interconnects and inductors, simultaneously. The invention deposits a conformal polymer over an area on a substrate with vias and an area without vias. Simultaneously, cavities are formed in the areas with and without vias. The depth of the cavities formed in the areas with vias will extend deeper into the substrate than the cavities formed in areas without vias. Such occurs because the polymer deposits unevenly along the surface of the substrate and more specifically, more thinly in areas with underlying depressions. Once filled with a conductive material, cavities which extend more deeply into the substrate, which were formed in areas with vias, become inductors, and the cavities which extend less deeply into the substrate, which were formed in areas without vias, become interconnects.

6 Claims, 2 Drawing Sheets

LIKE INTEGRATED CIRCUIT DEVICES WITH DIFFERENT DEPTH

FIELD OF THE INVENTION

The invention relates generally to semiconductor manufacturing and more particularly to integrated circuit devices with similar structure and dissimilar depth.

DESCRIPTION OF THE RELATED ART

In semiconductor manufacturing, integrated circuit devices are formed in multiple process steps. Each eliminated process step reduces manufacture time, saves costs, and expedites time to market. Therefore, step reduction is an important asset in the semiconductor industry.

Integrated circuit devices with similar structure and depth in the same layer of the integrated circuit can be formed in one step, which advantageously reduces manufacture steps. One problem encountered in semiconductor manufacturing, however, is the manufacture of integrated circuit devices of similar structure but dissimilar depth. Currently, such structures are formed separately, which increases manufacture time, cost, and delays time to market.

Integrated circuit devices with similar structure but dissimilar depth in the same layer of the integrated circuit cannot be formed in one step with prior art methods. Such devices include passive devices and interconnects. Passive devices, which are frequently used in radio frequency devices, such as cell phones, pagers, personal digital assistants, and global positioning systems, are deeper than interconnects because with depth, performance of the passive device improves. The performance of the passive device improves because the cross sectional area of the passive device increases, which in turn decreases resistance in the passive device. By contrast, interconnect performance diminishes with depth. The performance of an interconnect diminishes because capacitance increases if the distance between other interconnects in the same layer remains constant. Therefore, there remains a need for the manufacture of integrated circuit devices of similar structure but dissimilar depth, such as interconnects and inductors, in one step.

What is needed in the art is an improved method for manufacturing integrated circuit devices with similar structure and dissimilar depth, such as interconnects and inductors, that does not require separate process steps.

BRIEF SUMMARY OF THE INVENTION

The claimed invention is directed to a method for simultaneously forming two cavities of different depth. The method comprises the steps of depositing and forming. A planarizing polymer is deposited on a semiconductor substrate over an area on the substrate with a depression and an area on the substrate absent the depression. The polymer has a depth differential between the area with the depression and the area absent the depression. The polymer is thicker in the area absent the depression than the area with the depression. A cavity in the polymer is simultaneously formed in the area absent the depression and in the area with the depression for a predetermined amount of time. After the predetermined amount of time, the cavity in the area with the depression is deeper than the cavity in the area absent the depression by substantially the depth differential of the polymer.

The claimed invention is directed to an integrated circuit. The integrated circuit comprises a substrate, a planarizing polymer, and at least two cavities. The substrate has an area with a depression and an area absent a depression. The planarizing polymer is deposited over the area with the depression and the area absent the depression. The polymer has a depth differential between the area with the depression and the area absent the depression. The polymer is thicker in the area absent the depression than the area with the depression. At least two cavities are formed through the polymer. One cavity is formed in the area with the depression and another cavity is formed in the area absent the depression. The cavity formed in the area with the depression extends deeper into the substrate than the cavity formed in the area absent the depression by the depth differential of the polymer.

The present invention manufactures integrated circuit devices of similar structure and dissimilar depth in one process step. The present invention requires no modification to existing semiconductor manufacturing processes. Devices with similar structure, but dissimilar depth may be created in one step. Therefore, the present invention reduces manufacture time, saves costs, and expedites time to market.

For at least the foregoing reasons, the invention improves upon semiconductor manufacturing.

BRIEF DESCRIPTION OF THE DRAWINGS

The features and the element characteristics of the invention are set forth with particularity in the appended claims. The figures are for illustrative purposes only and are not drawn to scale. Furthermore, like numbers represent like features in the drawings. The invention itself, however, both as to organization and method of operation, may best be understood by reference to the detailed description which follows, taken in conjunction with the accompanying figures, in which:

DETAILED DESCRIPTION OF THE INVENTION

The invention will now be described with reference to the accompanying figures. In the figures, various aspects of the structures have been shown and schematically represented in a simplified manner to more clearly describe and illustrate the invention.

By way of overview and introduction an embodiment of the present invention comprises the steps of depositing a planarizing polymer and forming a first and second cavity through the polymer. A planarizing polymer is deposited over an area on a semiconductor substrate that includes areas with and without depressions. The polymer deposits unevenly on the surface of the substrate. More specifically, the polymer deposits more thickly in the area without depressions than the area with depressions. The difference between the thickness of the polymer over the areas with depressions versus the areas without depression will be referred to as the thickness differential. At the same time, a first cavity is formed in the area with depressions and a second cavity is formed in the area without depressions. The cavities are formed under a timed etch, such as reactive ion etch and or wet etch post litho exposure. The formation of the cavity can be formed, but is not limited to, reactive ion etch and it should be clear to any skilled in the art that any other method could be considered. Therefore, with respect to each other the cavities have the same depth. However, the cavity formed in the area with the depression will extend deeper into the substrate than the cavity formed in the area without the depression. The cavity formed in the area with the depression will extend deeper into the substrate by a depth equivalent to the thickness differential of the polymer.

A further embodiment of the present invention comprises an integrated circuit having a substrate, a planarizing polymer, and at least two cavities. The substrate has an area with a depression and an area absent the depression. The planarizing polymer is deposited over the areas with and without the depression. However, the polymer will have a thickness differential between the polymer deposited on the area with the depression and the area without the depression. At least two cavities are formed in the polymer. Once cavity is formed in an area without depression and a second cavity is formed in an area with depression. The cavities will be equally deep with respect to each other, but the cavity formed over the area with the depression will extend deeper into the substrate by a depth roughly equivalent to the thickness differential. This relatively equivalent depth can be adjusted by varying of the etch chemistries and power used, this would be obvious to one that is skilled in the art.

Figure 1A:
FIGS. 1a-1c depict a method of an embodiment of the present invention.
Figure 1B:
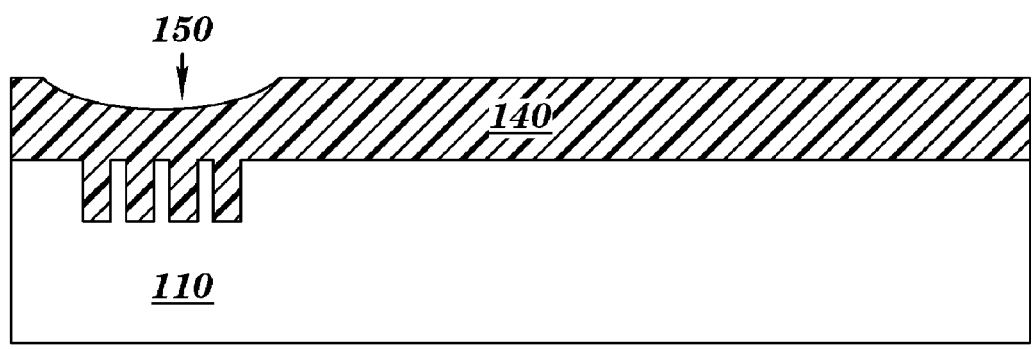
Figure 1C:
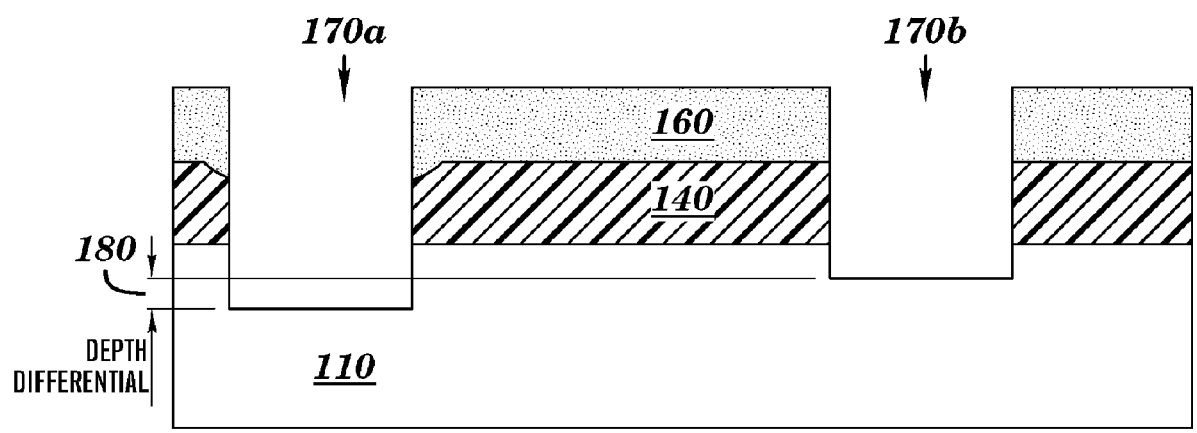

FIG. 1a-c depict a method of an embodiment of the present invention. FIG. 1a shows an integrated circuit with substrate 110 having areas with depressions 120 and areas without a depression 130. FIG. 1b depicts a substrate 110 with a planarizing polymer 140 deposited over the areas with and without depressions respectively. As shown, the polymer 140 is thinner in areas over depressions 150. Two cavities are formed through the planarizing polymer 140 in FIG. 1c. Cavities 170a,b are formed through the polymer in the area with the depressions 120 and in the area without the depression 130. The depth of the cavities 170a,b is unequal. As shown in FIG. 1c, the cavity 170a, which is formed over the area with depressions, is deeper than the cavity 170b, which is formed over the area without depressions. The depth differential 180 is shown in FIG. 1c. The cavities are simultaneously formed by lithography and reactive ion etch. FIG. 1c depicts the photo resist 160 used in lithography and reactive ion etch steps. Thereafter, the cavities are filled with a conductive metal by physical vapor deposition, chemical vapor deposition, sputtering, plating, or any combination of the same. Once filled with conductive metal, the cavities 170a becomes an inductor and cavity 170b becomes an interconnect. In so doing, such embodiment of the present invention creates devices of similar structure, simultaneously.

Figure 2:
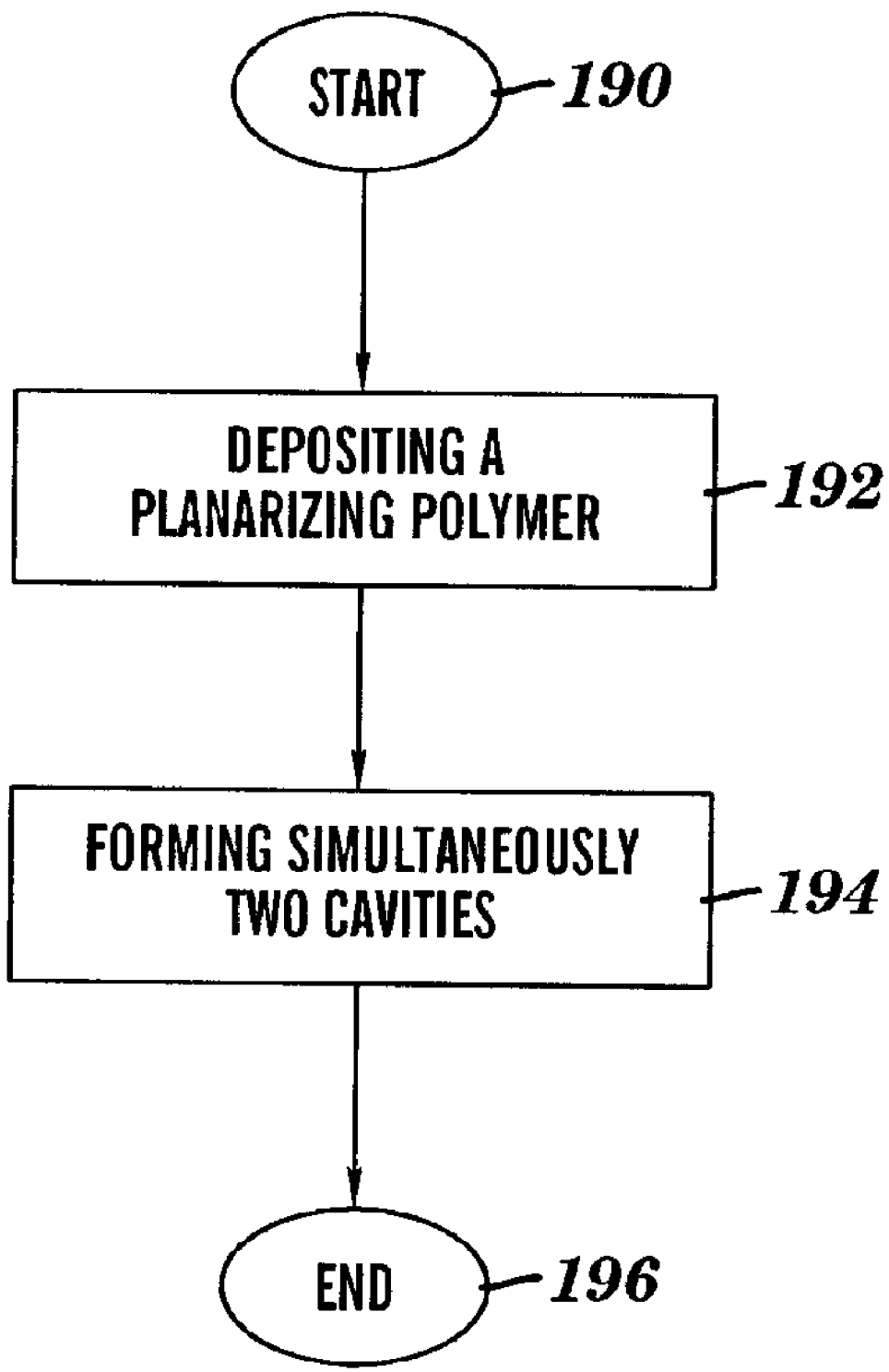
FIG. 2 depicts a method of an embodiment of the present invention.

FIG. 2 depicts a method of an embodiment of the present invention. FIG. 2 depicts the steps of depositing and forming. The step of depositing a polymer 192 includes depositing a planarizing polymer over a substrate that has areas with and without depressions. The forming step 194 includes forming a cavity in the polymer over an area without depressions and a cavity in the polymer over an area with depressions, simultaneously, for a predetermined amount of time. Because polymer is deposited unevenly, and more specifically, thinner in areas with depressions, the depth of the cavity, which is formed over an area with depressions, extends deeper into the substrate than the depth of the cavity formed over the area without depressions. An area with depressions is an area with vias.

While not depicted in FIG. 2, once the two cavities are formed, the final step towards creation of the integrated circuit devices includes filling the cavities with conductive material. Once filled, the cavity that extends less deeply into the substrate becomes an interconnect and the cavity that extends more deeply into the substrate becomes an inductor. It is well known that resistance is inversely proportional to the cross sectional area of a conductor. Therefore, inductor performance improves with an increase to the cross sectional area of the conductive material, which explains the necessity for a deeper extension of the cavity into the substrate for the inductor as compared with the less deep extension of the cavity into the substrate for the interconnect.

The claimed invention capitalizes on the understanding that the polymer deposits more thinly on the areas with depressions. Cavities formed over areas with depressions will extend more deeply into the underlying substrate. It is a desirable feature for some devices, such as inductors, to extend more deeply into the substrate, then other devices such as interconnects. The claimed invention, in one step, enables the simultaneous creation of interconnects and inductors, which have a similar shape, but dissimilar depth into the substrate, by capitalization on the understanding that a planarizing polymer is thinner when deposited over an area with a depression.

The claimed invention was successfully implemented on a 300 mm wafer with embedded devices that varied in width from 0.09 to 1.0 micron. It was discovered that a thinner planarizing film was created, if a planarizing polymer was deposited over areas with depressions, such as vias. It was discovered that the planarizing film over areas with depressions was between 25-40% thinner than over areas without depressions. For example, if the planarizing film had a target thickness of 3000 Angstroms over areas without depressions, it was discovered that the planarizing film had a thickness of 2250-1800 Angstroms over areas with depressions. It was further discovered that areas with depressions could be strategically placed in areas for subsequent placement of deep structures, such as inductors. To create structures, such as interconnects and inductors, the combination of lithography and reactive ion etch ("RIE") is performed. RIE step must etch away 750-1200 Angstroms more planarizing film in areas without depressions. Thus, the devices etched in areas with depressions will be between 750-1200 Angstroms deeper than devices etched in areas without depressions. Therefore, it was discovered that areas with depressions could be strategically placed wherever deep devices, such as inductors, would be subsequently required.

The planarizing film created in accordance with the successful implementation of the claimed invention described above was created as follows. A polymer was used that has conformal properties at low spin speeds and planarizing properties at higher spin speeds. An exemplary polymer includes, but is not limited to, NFC 1400 from JSR. An exemplary low spin speed includes, but is not limited to, 500-800 revolutions per minute (rpms), while an exemplary high spin speed includes, but is not limited to, 900-2300 rpms. First, a solvent that is compatible with the polymer such as, but not limited to PGMEA, was deposited on the semiconductor substrate at a spin speed of 1000 rpms for less than 0.5 seconds. Then the polymer was deposited on the solvent at a spin speed of 2500 rpms for approximately 2.50 seconds to disperse the solvent. The spin speed was then reduced to 100 rpms for one second in an effort to conserve the planarizing polymer. The thickness of the polymer was then created by casting a spin speed of 900-2300 rpms for 30.0 seconds. Finally, the planarizing polymer is cured at a minimum temperature of 170.0° C. in order to create a stable film.

While the invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the invention.

What is claimed is:

1. A method for simultaneously forming two cavities of different depth, in an integrated circuit, comprising the step of:

depositing a planarizing polymer on a semiconductor substrate over an area on the substrate with a depression and an area on the substrate absent said depression, said polymer having a depth differential between said area with said depression and said area absent said depression, said polymer thicker in said area absent said depression than said area with said depression;

forming simultaneously a cavity in said polymer in said area absent said depression and in said area with said depression for a predetermined amount of time, after said predetermined amount of time said cavity in said area with said depression is deeper than said cavity in said area absent said depression by substantially said depth differential of said polymer; and filling said cavities with a conductive material.

2. A method as in claim 1, said depression includes a plurality of vias.

3. A method as in claim 1, said cavities are formed by one of lithography, reactive ion etch, and wet etch.

4. A method as in claim 1, said deposited polymer is 25.0-45.0% thinner over said area with said depression than said area absent said depression.

5. A method as in claim 1, said cavities are filled by at least one of physical vapor deposition, chemical vapor deposition, sputtering, and plating.

6. A method as in claim 1, said cavity filled with said conductive material over said area with said depression is an inductor and said cavity filled with said conductive material over said area absent said depression is an interconnect.

* * * * *